US005240428A

United States Patent [19]

Nakata et al.

[11] Patent Number: 5,240,428

[45] Date of Patent: Aug. 31, 1993

[54] WORKING MACHINE SAFETY DEVICE

[75] Inventors: Hiroshi Nakata; Shigeo Take; Masao Iwata; Hiromi Watanabe; Yoshinori Ishikawa, all of Yokosuka, Japan

[73] Assignees: Kioritz Corporation, Tokyo; Oppama Kogyo Kabushiki Kaisha, Kanagawa, both of Japan

[21] Appl. No.: 902,450

[22] Filed: Jun. 18, 1992

Related U.S. Application Data

[63] Continuation of Ser. No. 688,119, Apr. 19, 1991, abandoned.

[51] Int. Cl.[5] .............................................. H10R 29/00

[52] U.S. Cl. .................................... 439/189; 439/130; 439/507

[58] Field of Search ............... 439/130, 133, 134, 188, 439/189, 507, 511, 620

[56] References Cited

U.S. PATENT DOCUMENTS

| | | | |
|---|---|---|---|
| 1,549,242 | 8/1925 | Wilson | 439/189 |
| 1,645,476 | 10/1927 | Fell et al. | 439/189 |
| 1,652,708 | 12/1927 | Leeuw | 439/189 |
| 3,004,170 | 10/1961 | Greenspan | 439/189 X |
| 3,935,852 | 3/1976 | Donovan et al. | |
| 4,637,668 | 1/1987 | Kleffman | 439/189 X |

*Primary Examiner*—Larry I. Schwartz
*Assistant Examiner*—Khiem Nguyen
*Attorney, Agent, or Firm*—Bauer & Schaffer

[57] ABSTRACT

A receiving part is provided externally of the body of a power tool, having an internal combustion engine provided with an ignition system. A plug is insertable in the receiving and has a portion of the ignition system incorporated in it. The receiving socket and the removable plug are provided respectively with connecting parts whereby, when fitted together, they will be electrically connected with each other, completing the ignition system.

1 Claim, 8 Drawing Sheets

WORKING MACHINE SAFETY DEVICE

This is a continuation of Ser. No. 688,119, filed Apr. 19, 1991 now abandoned.

FIELD OF THE INVENTION

This invention relates to apparatus for preventing the unauthorized use of power tools and portable machines having an internal combustion engine for a prime mover and, in particular, to a safety device for power tools such as a chain saw or mower.

BACKGROUND OF THE INVENTION

Gasoline power tools such as chain saws or mowers have been provided with a stopping switch for stopping the ignition of its engine but is not provided with anything corresponding to an ignition key mechanism or door locking mechanism as in an automobile or motor cycle and, therefore, such relatively portable machines can be used by anyone, simply by operating the internal combustion engine comprising the prime mover.

Therefore, even a child may mistakenly such tools, causing an accident or injury to himself or others. A thief can also easily use the tool resulting in a prolification in the loss of such tools.

OBJECT OF THE INVENTION

The present invention has as its object to provide a safety device whereby a power tool can be prevented from being used by others than its rightful user or from being inadvertently used by a child or the like so that accident resulting in injury or death can be prevented. Another object is to prevent the tool from being stolen. Still another object is to provide a structurally simple and inexpensive safety device for such power tools.

SUMMARY OF THE INVENTION

For this object, the safety device according to the present invention comprises a receiving socket provided outside the body of the power tool and a removable plug insertable into the receiving socket. A portion of the ignition system of the internal combustion engine is incorporated in the plug, while the remainder of the system is built into the body of the chain saw. The receiving socket and removable plug are provided respectively with connecting parts where, when the removable plug is attached to the receiving socket, they will be electrically connected with each other and the portion of the ignition system in the plug will be electrically connected to the ignition system in the body.

According to the present invention, when the power tool is out of use, the plug will be removed from the receiving socket and will be kept by the rightful owner or user. In this case, since a part of the ignition system is incorporated in the removable plug, it will be electrically separated from the rest of the igniting system within the body of the power tool. As a result, the ignition system will not be able to function and no ignition spark will be fed to the engine. Therefore, the internal combustion engine will not be able to be operated, and the power tool will be prevented from being used.

When the rightful user is to use the power tool, the plug is inserted into the receiving socket, completing electrical connection with the remainder of the ignition system, and a normal ignition spark will be able to be fed to the internal combustion engine so that it will be able to be operated and the power tool used.

Thus, according to present invention, there are obtained advantages that when the rightful user of the power tool handles the removable plug much in the manner as he would the ignition key of an automobile or the like, the power tool will be prevented from being used by others than its rightful user and will be prevented from being stolen.

The safety device according to the present invention has cooperating connecting parts provided respectively in the receiving socket and in the removable plug does not have a complicated structure as in the ignition key system of an automobile or the like and, therefore, has the advantage that it can be provided at a low cost.

BRIEF DESCRIPTION OF THE DRAWINGS

As seen in FIGS. 1–4, the chain saw B comprises a built-in internal combustion engine (not illustrated), a saw chain guide bar 4 and a saw chain 5 driven along the outer periphery of the saw chain guide bar 4 by the power of the internal combustion engine.

Figure 1:
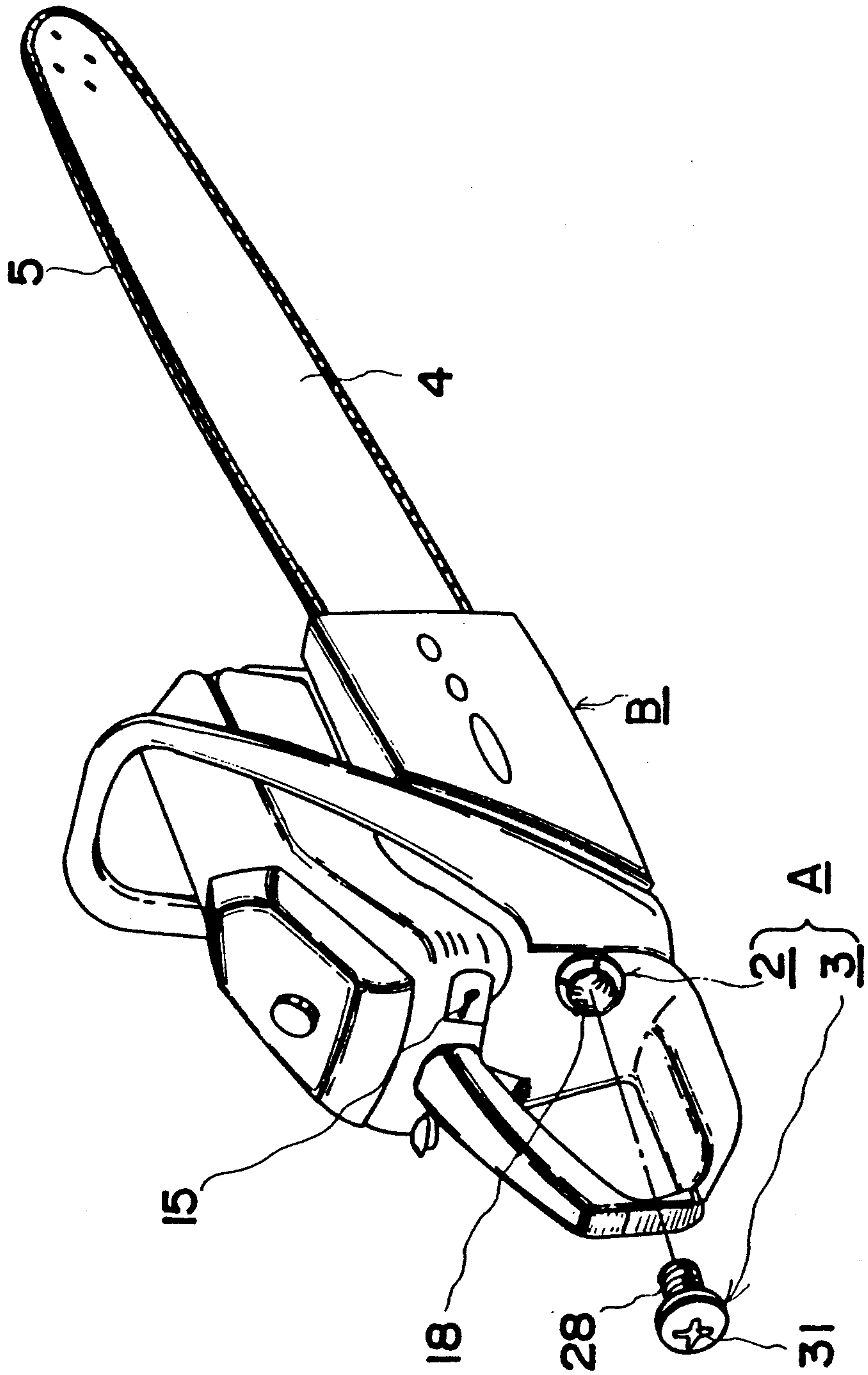
FIG. 1 is a perspective view of a chain saw fitted with a safety device in accordance with a first embodiment of the present invention.
Figure 2:
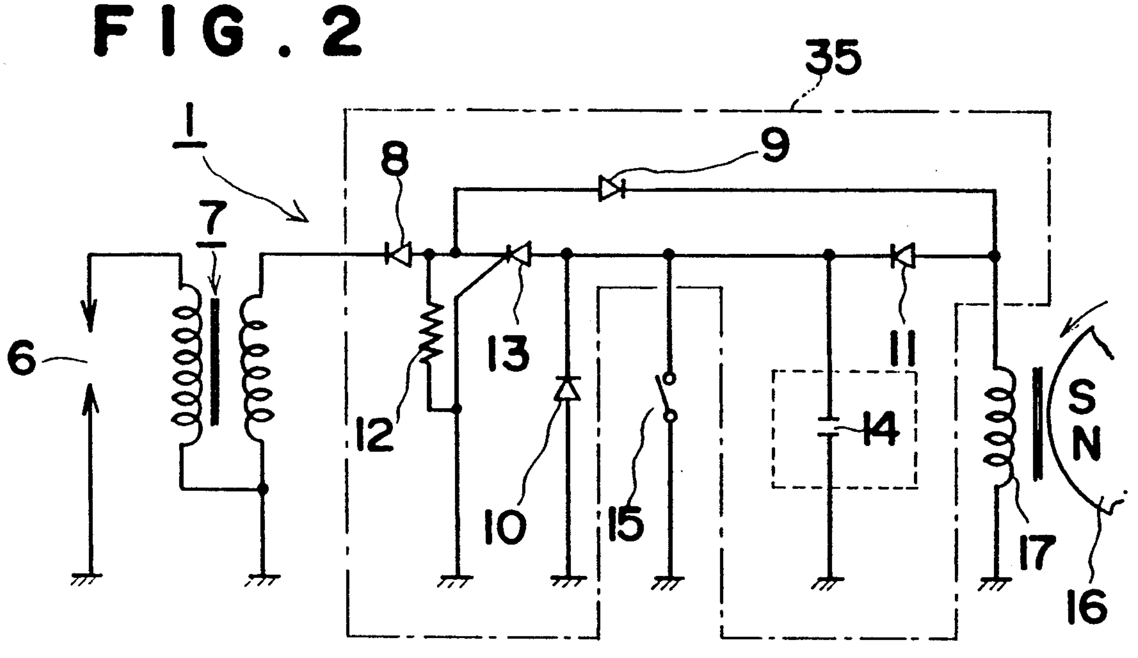
FIG. 2 is an electric circuit diagram of an ignition system.
Figure 3:
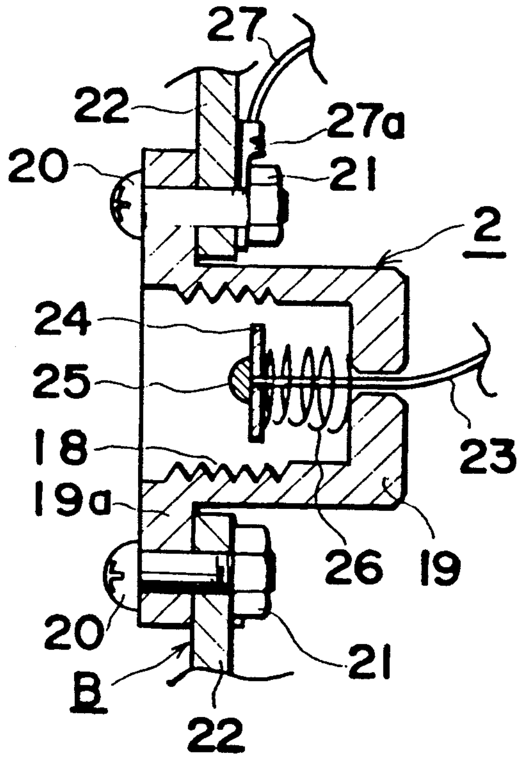
FIG. 3 is a vertically sectioned view of the receiving socket of the safety device seen in FIG. 1.

In the embodiment shown in FIGS. 1–4, a safety device is combined with the ignition system 1 comprising, as shown in FIG. 2, a spark plug 6, an ignition coil 7, diodes 8, 9, 10, and 11, a resistor 12, a thyristor 13, a capacitor 14, an ignition stopping switch 15, a rotor 16 in which is embedded a magnet rotating in synchronism with the rotation of the internal combustion engine and a power generating coil 17 arranged near the rotor 16. In this ignition system 1, when a voltage of a positive direction is induced in the power generating coil 17, the capacitor 14 will be charged to a predetermined level and, when a negative direction voltage is induced in the power generating coil 17, the thyristor 13 will be conductive and the capacitor 14 will be discharged to the primary coil of the ignition coil 7 through this thyristor 13 to obtain an ignition spark at the spark plug 6.

As shown in FIG. 1, the safety device A in accord with the present invention comprises receiving socket 2 and a removable plug 3.

In the embodiment of FIGS. 1–4, the receiving socket 2 is formed of a cup-like member 19 made of a conductive material having a female screw thread formed on the inner periphery. The cup has a flange 19_a_ fixed to a conductive metal case 22 forming the body of the chain saw B with screws 20 and nuts 21. In this manner, the receiving socket 2 is open externally of the body of the chain saw B. The capacitor 14 of the ignition system is housed in the removable plug 3, while the rest of the ignition system shown in FIG. 2 is incorporated in the body of the chain saw B. An insulated coated lead wire 23 is connected at one end with the capacitor 14 by being inserted through the cup-like member 19 and through an insulating plate 24 to be connected to an electrode 25 provided on an insulating plate 24. A spring 26 is provided between the insulating plate 24 and the bottom of the cup-like member 19. The contact point on the ground side of the capacitor 14 as illustrated in FIG. 2 is electrically connected to the cup-like member 19 through the case 22 by a lead wire 27 fitted with a press-contact terminal 27a.

Figure 4:
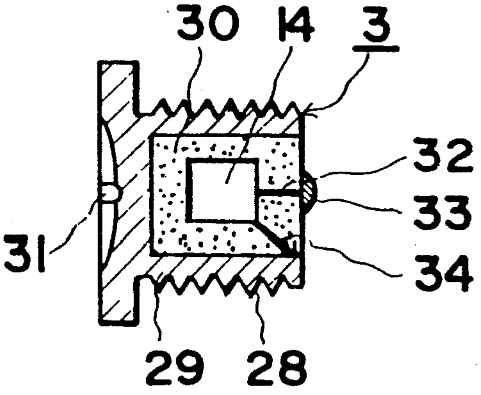
FIG. 4 is a vertically sectioned view of the removable plug of the safety device of FIG. 1.

In FIG. 4, the capacitor 14 is embedded with an insulative synthetic resin 30 within a tubular member 29, forming the plug 3. The tubular member 29 is made of a conductive material and has a male screw thread 28, conforming to the female screw 18 of the receiving socket 2 formed on its outer periphery so that it can be removably attached to the receiving socket 2. The head of the tubular member 29 is provided with a screw driving plug hole 31 so that the plug 3 may be easily screwed into the female screw. The capacitor 14 is embedded in one end of tubular member 29 and is connected to an electrode 33 provided at the exposed end of the synthetic resin 30, via a lead wire 32. The other connecting end of the capacitor 14 is connected to the wall of the tubular member 28 via another lead wire 34.

Therefore, in the embodiment shown in FIGS. 1–4, when the removable plug 3 is screwed and fitted into the receiving socket 2, the electrodes 25 and 33 (FIG. 2) will be electrically connected with each other, and the cup-like member 19 and tubular member 29 will be electrically connected with each other. As a result, the capacitor 14 illustrated in FIG. 2 will be electrically connected in circuit with the remainder of the ignition system as shown in FIG. 2 the chain saw B may become electrically operable.

When the use of the chain saw B ends, the plug 3 will be removed from the receiving socket 2 and will be kept by the rightful user. Therefore, as the capacitor 14, which is an essential part of the ignition system 1, will be electrically separated from the rest of the ignition system, the ignition system 1 will no longer be able to function and no ignition spark will be able to be fed to the internal combustion engine. Therefore, the internal combustion engine will be unable to operate, and the use of the chain saw B will be prevented.

When the rightful user reinserts the plug 3 into the receiving socket 2 the capacitor 14 is reincorporated into the ignition system so that the ignition system will be able to perform its operating function and the internal combustion engine may be fed with normal igniting sparks. Therefore, the internal combustion engine of the chain saw B will be able to operate and the chain saw B will be able to be used.

Thus, the safety device according to the present invention, when the removable plug 3 is handled in the same manner as the ignition key in an automobile or the like, the chain saw B will be prevented from being used by others than the right user and from being mistakenly used by a child or the like and will be prevented from being stolen.

In the embodiment shown in FIGS. 1–4, the capacitor 14 is embedded in a synthetic resin 30. It may also be incorporated by any other means. Not only can the capacitor 14 be embedded but so can any of the other parts of the circuit 35. The part to be incorporated need not be specifically limited to the capacitor.

Figure 5:
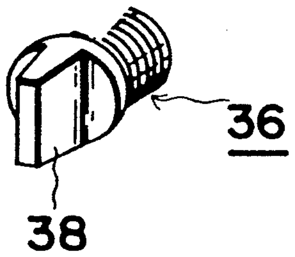
FIG. 5 is a perspective view of another removable plug.
Figure 6:
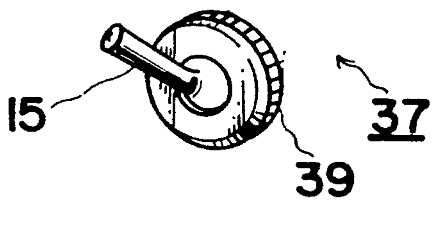
FIG. 6 is a perspective view of further another removable plug.

The removable plug 36 illustrated in FIG. 5 or the removable plug 37 illustrated in FIG. 6 can be used in place of the removable plug 3 shown in FIGS. 1 and 4. The removable plug 36 and the removable plug 37 are formed in fundamentally the same manner as the plug 3 shown in FIGS. 1 and 4 but with some differences. The plug 36 illustrated in FIG. 5 is different in that a grip 38 is provided on its head instead of the screw driver plug hole 31 so that it may be installed within using a screw driver. The plug 37 illustrated in FIG. 6 is different in that slip preventing grooves 39 (i.e. knurls) are formed on its peripheral surface instead of the screw driver plug hole 31 and that the ignition stopping switch 15 is incorporated in the head instead of in the body of the chain saw B as shown in FIG. 1.

Further, as in the embodiment shown in FIGS. 1–4, the plugs 36 and 37 are formed with threaded shanks which can be screwed into the female screw 18 located in the body of the chain saw B. Needless to say, any other removably plug structure may be adopted in the present invention.

Figure 7:
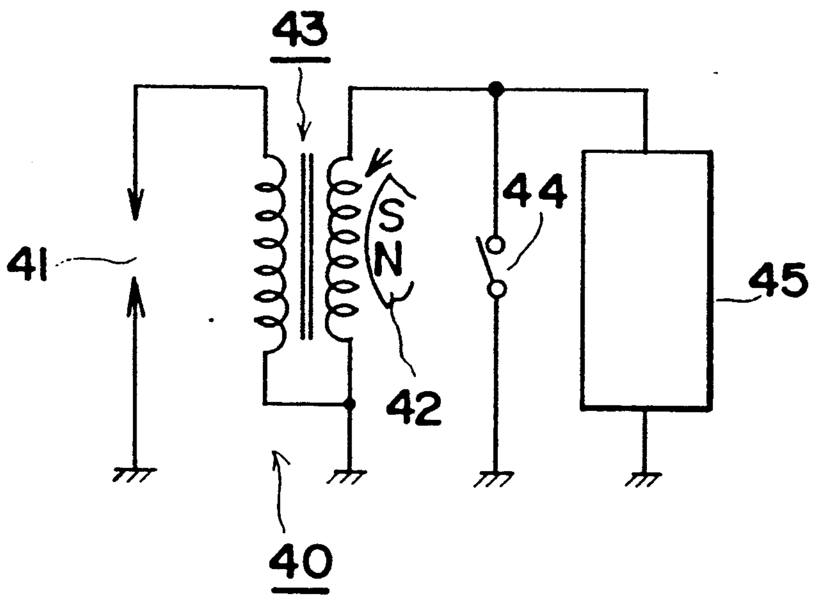
FIG. 7 is an electric circuit diagram of a second ignition system.
Figure 8:
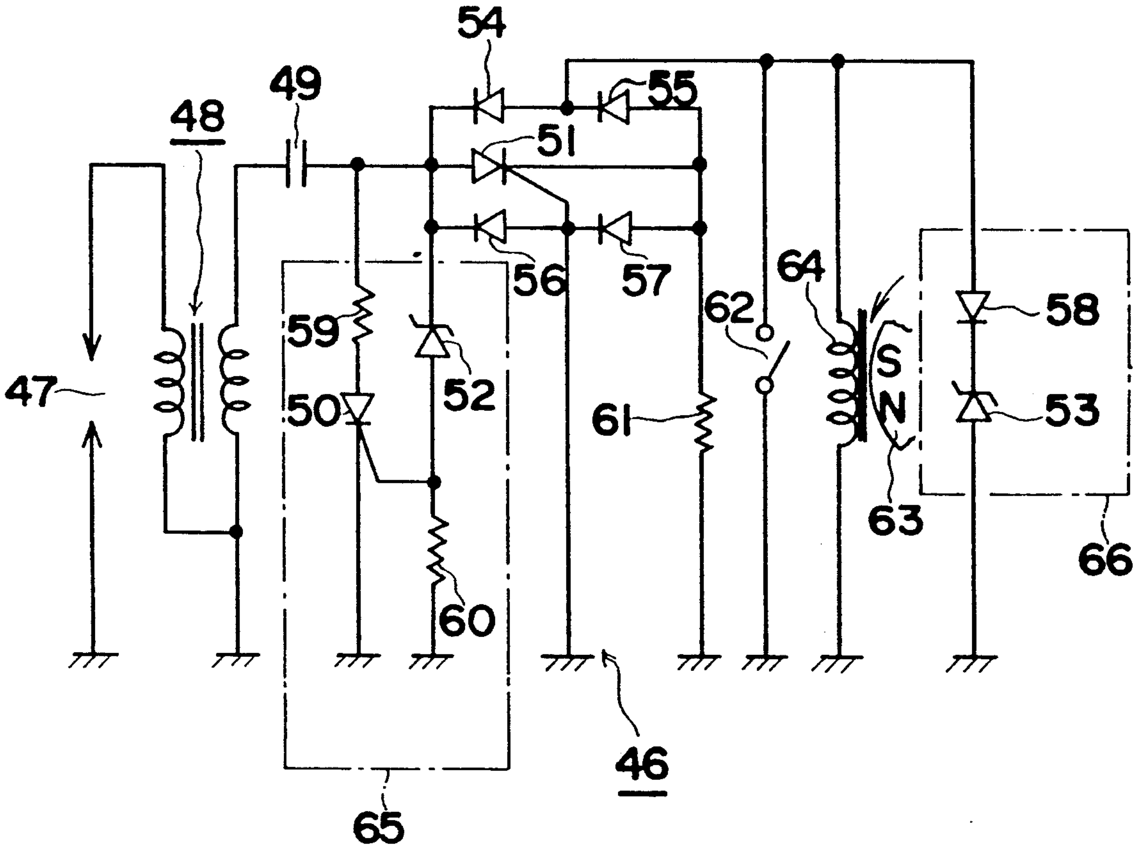
FIG. 8 is an electric circuit diagram of a further ignition system.
Figure 9:
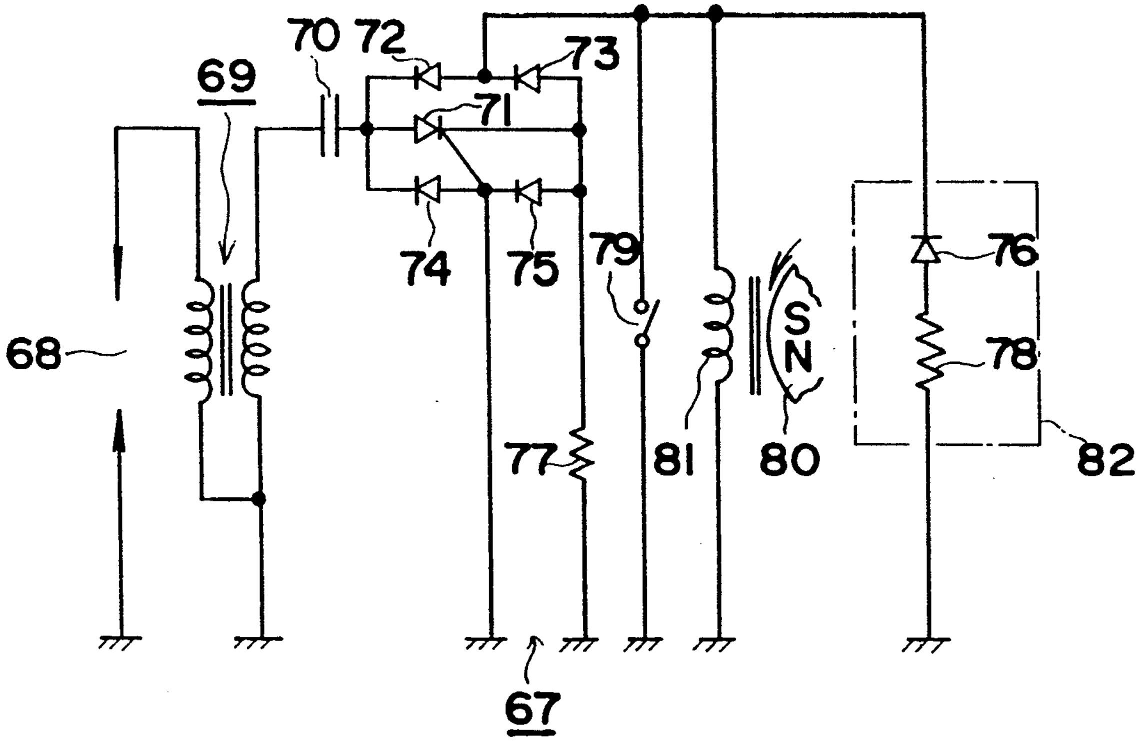
FIG. 9 is an electric circuit diagram of still another ignition system.

The present invention is not limited to the ignition system 1 shown in FIG. 2, and the chain saw B may be provided with systems shown, for example, in FIG. 7, 8, or 9.

The ignition system 40 shown in FIG. 7 is formed as of a so-called current interrupting type comprising an ignition plug 41, a rotor 42, in which is embedded a magnet, rotating in synchronism with the rotation of the internal combustion engine, an ignition coil 43 arranged near the rotor 42, an ignition stopping switch 44 and an ignition controlling circuit (not illustrated in detail) 45. In this system 40, when a positive direction voltage is induced in the primary coil of the ignition coil 43, a primary short-circuit current will be caused to flow, by the ignition controlling circuit 45. When this primary short-circuit current is interrupted by the ignition controlling circuit 45, an ignition spark will be obtained at the plug 41. As a part of the ignition system 40, for example, the ignition controlling circuit 45 may be incorporated into the removable plug 3 shown in the embodiment of FIGS. 1–4.

The ignition system 46 shown in FIG. 8 comprises a plug 47, an ignition coil 48, a capacitor 49, thyristors 50 and 51, Zener diodes 52 and 53, diodes 54, 55, 56, 57, and 58, resistors 59, 60, and 61, an ignition stopping switch 62, a rotor 63 in which is embedded a magnet rotating as synchronized with the rotation of the internal combustion engine and a power generating coil 64. The first Zener diode 53 functions to break over at a positive direction voltage of the power generating coil 64, which is lower than that of the second Zener diode 52. FIG. 8, without the circuit parts 65 and 66, shows a conventionally provided ignition system. In the ignition system 46 shown in FIG. 8, the circuit portion 65 acts to prevent the normal ignition operation, and the circuit portion 66 can render the circuit 65 ineffective, are added to the conventional system. The circuit portion 66 may be incorporated into the removable plug 3 in the embodiment shown in FIGS. 1–4.

Incidentally, in the ignition system 46 of FIG. 8, shown in the connected state, when a positive direction voltage is obtained in the power generating coil 64, the Zener diode 53 will break over; thereby the Zener diode 52 will be prevented from breaking over, the thyristor 50 will be kept non-conductive, and the capacitor 49 will be charged to a predetermined voltage, the voltage being determined by the Zener diode 53. When a negative direction voltage is obtained in the power generating coil 64, the thyristor 51 will be conductive and the charge of the capacitor 49 will be quickly discharged to the primary coil of the ignition coil 48, and an ignition spark will be obtained at the ignition plug 47. On the other hand, when the circuit portion 66 is removed, a positive direction voltage is obtained in the power generating coil 64, the Zener diode 52 will break over, the thyristor 50 will be conductive, and, as a result, the charge of the capacitor 49, until the Zener diode 52 breaks over, will be discharged comparatively slowly through the course of the thyristor 50 and the primary coil of the ignition coil 48. Therefore, as the charge will be discharged comparatively slowly, no ignition spark will be generated at the ignition plug 47. Even if a negative direction voltage is obtained in the power generating coil 64 and the thyristor 51 is made conductive, the capacitor 49 will not be charged enough to obtain an ignition spark at the ignition plug 47. Thus, in the igniting system 46 shown in FIG. 8, the normal igniting operation will be made, except when the circuit portion 66 is removed, in which case a misfiring will be made.

Figure 10:
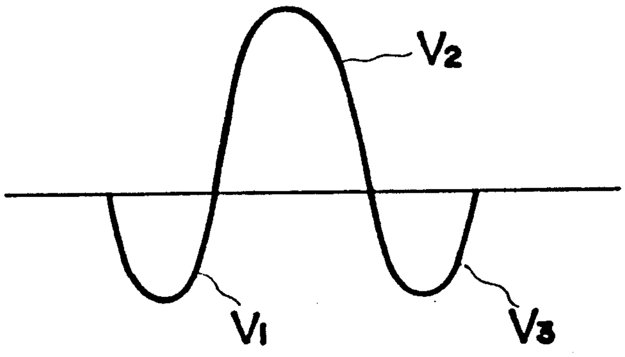
FIG. 10 is a non-load voltage waveform of a power generating coil.

The ignition system 67 shown in FIG. 9 comprises an ignition plug 68, an ignition coil 69, a capacitor 70, a thyristor 71, diodes 72, 73, 74, 75, and 76, resistors 77 and 78, an ignition stopping switch 79, a rotor 80 in which is embedded a magnet rotating in synchronism with the rotation of the internal combustion engine and a power generating coil 81 arranged near the rotor 80 and having a non-load voltage waveform as shown in FIG. 10. In the conventional ignition systems of FIG. 9, the circuit part 82 is not provided and the constant value of the resistor 77 is selected to be comparatively small. In the present invention the system 67 shown in FIG. 9 provides a constant for the resistor 77 which is selected to be comparatively large so as to prevent the normal igniting operation in the otherwise convention portions of the system and the circuit 82 is provided to effect the normal igniting operation in spite of the high value. The circuit 82 may be incorporated into the removable plug 3 of the embodiment shown in FIGS. 1-4.

In FIG. 9, the connected state is shown so that when a positive direction voltage V1 (shown in FIG. 10) is obtained in the power generating coil 81, the thyristor 71 will be non-conductive, and, therefore, the capacitor 70 will be charged, but when a second negative direction voltage V3 (shown in FIG. 10) is obtained in the power generating coil 81, the thyristor 71 will be conductive and the charge of the capacitor 70 will be discharged to the primary coil of the ignition coil 69, and an ignition spark is obtained at the plug 68.

When a negative direction voltage is obtained in the power generating coil 81, an electric current will flow also through the resistor 78 and diode 76, and a current flowing through the resistor 77 will be branched to this path. Therefore, unless the level of the negative direction voltages V1 and V3 of the power generating coil 81 is comparatively high, a sufficient trigger voltage will not be applied to the thyristor 71. Therefore, as seen from FIG. 10, by the time the positive direction voltage V2 is impressed on the coil 81 after the negative direction voltage V1, a sufficient turn-off time will have been given to the thyristor 71 and, when the positive direction voltage V2 shown in FIG. 10 is obtained in the power generating coil 81, the thyristor 71 will be kept non-conductive. On the other hand, when the circuit 82 is removed from the system of FIG. 9 and when the first negative direction voltage V1 is impressed on the power generating coil 81, the thyristor 71 will be conductive, but, as the resistor 78 and diode 76 are removed, there will be no such branch flow through resistor 77 as the constant of the resistor 77 is selected to be comparatively large.

Even if the level of the negative direction voltage V1 of the power generating coil 81 is comparatively low, a sufficient trigger voltage will be applied to the thyristor 71. Therefore, by the time the positive direction voltage V2 is obtained successively to the above-mentioned negative direction voltage V1, sufficient turn-off time will not be given to the thyristor 71 once turned off under the negative direction voltage V1, and even when the positive direction voltage V2 is obtained in the power generating coil 81, the thyristor 71 will remain conductive. Therefore, even if the positive direction voltage V2 is obtained in the power generating coil 81, the capacitor 70 will not be charged and, even if the second negative direction voltage V3 is obtained in the power generating coil 81, the thyristor 71 becomes conductive. No ignition spark will then be obtained at the ignition plug 68. Thus, in the ignition system 67 shown in FIG. 9, the normal igniting operation will be made when in the connected state shown but when the circuit part 82 is removed, a misfiring stage will be made.

In the above explained embodiments, the present invention is applied to the chain saw B. However, the present invention can be applied to such other various power tools as mowers.

As explained in detail in the above, the present invention provides advantages wherein any internal combustion power tool can be prevented from being used by others than its rightful user, thereby preventing accidents and preventing the power tool from being stolen. Thus, the safety device is simple in structure and is inexpensive.

What is claimed is:

1. A system for preventing the unauthorized use of a power tool having an internal combustion engine comprising an ignition system including a multi-element electronic controlling circuit for providing a spark to said engine, a receiving socket comprising a threaded hole in the body of said power tool and open externally of said body, and a removable plug comprising a threaded bolt insertable in said receiving socket, said electronic circuit having its component electronic elements divided into two portions, one of said portions being located in said body and in circuit connection with said receiving socket, the other of said portions being insulating by embedded in said plug, said receiving socket and said plug being provided with mating screw threads and having cooperating contacts, said contacts being located so that complete screwing of said plug into said receiving socket is required to operatively connect the portions of said electronic control circuit.

* * * * *

UNITED STATES PATENT AND TRADEMARK OFFICE
CERTIFICATE OF CORRECTION

PATENT NO. : 5,240,428

DATED : August 31, 1993

INVENTOR(S) : Nakata, et al.

It is certified that error appears in the above-identified patent and that said Letters Patent is hereby corrected as shown below:

Column 6, line 59: replace "insulating by" with --insulatingly--.

Signed and Sealed this

Fifth Day of April, 1994

Attest:

BRUCE LEHMAN

*Attesting Officer* *Commissioner of Patents and Trademarks*